US009502325B2

(12) United States Patent
Clevenger et al.

(10) Patent No.: US 9,502,325 B2
(45) Date of Patent: Nov. 22, 2016

(54) INTEGRATED CIRCUIT BARRIERLESS MICROFLUIDIC CHANNEL

(71) Applicant: INTERNATIONAL BUSINESS MACHINES CORPORATION, Armonk, NY (US)

(72) Inventors: Lawrence A. Clevenger, Rhinebeck, NY (US); Vincent J. McGahay, Poughkeepsie, NY (US); Joyeeta Nag, Wappingers Falls, NY (US); Yiheng Xu, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/158,664

(22) Filed: May 19, 2016

(65) Prior Publication Data
US 2016/0254208 A1 Sep. 1, 2016

Related U.S. Application Data (63) Continuation of application No. 15/067,267, filed on Mar. 11, 2016, now Pat. No. 9,385,062, which is a continuation of application No. 14/574,551, filed on Dec. 18, 2014, now Pat. No. 9,373,561.

(51) Int. Cl.
*H01L 23/48* (2006.01)
*H01L 23/52* (2006.01)
(Continued)

(52) U.S. Cl.
CPC ........... *H01L 23/367* (2013.01); *H01L 23/528* (2013.01); *H01L 23/5226* (2013.01)

(58) Field of Classification Search
USPC .......................... 257/751, 522, 758; 438/712
See application file for complete search history.

(56) References Cited

U.S. PATENT DOCUMENTS

| 6,521,516 B2 | 2/2003 | Monzon et al. |
| 6,713,835 B1 | 3/2004 | Horak et al. |

(Continued)

FOREIGN PATENT DOCUMENTS

| CN | 201490184 U | 5/2010 |
| EP | 2140256 B1 | 6/2012 |

(Continued)

OTHER PUBLICATIONS

Joo et al., "Fabrication of Monolithic Microchannels for IC Chip Cooling", Micro Electro Mechanical Systems (MEMS '95), 1995, Proceedings. IEEE, DOI: 10.1109/MEMSYS.1995.472569, pp. 362-367.

(Continued)

*Primary Examiner* — Errol Fernandes
(74) *Attorney, Agent, or Firm* — Reza Sarbakhsh (57) ABSTRACT

A structure and method for fabricating a continuous cooling channel in the back end of line wiring levels of an integrated circuit (IC) chip is provided. This continuous cooling channel may provide a path for a cooling source such as a fluid pumped from an external fluidic-cooling circulation driver to make physical contact locally with and cool the back end levels within the IC chip that may generate heat as a byproduct of the IC device's routine operations. Such a cooling structure is achieved by removing a horizontal portion of a barrier layer from an intermediate region of an interlevel interconnect structure, selective to a vertical portion of the barrier layer located on a sidewall of the interlevel interconnect structure, using gas cluster ion beam etching as well as removing the bulk conductor by additional means.

1 Claim, 11 Drawing Sheets

(51) Int. Cl.
*H01L 29/40* (2006.01)
*H01L 23/367* (2006.01)
*H01L 23/522* (2006.01)
*H01L 23/528* (2006.01)

(56) References Cited

U.S. PATENT DOCUMENTS

| | | |
|---|---|---|
| 7,139,172 B2 | 11/2006 | Bezama et al. |
| 7,294,926 B2 | 11/2007 | Schubert et al. |
| 7,656,027 B2 | 2/2010 | Dangelo et al. |
| 7,696,015 B2 | 4/2010 | Kim et al. |
| 7,928,563 B2 | 4/2011 | Bakir et al. |
| 7,936,563 B2 | 5/2011 | Gosset et al. |
| 7,948,077 B2 | 5/2011 | Andry et al. |
| 8,097,949 B2 | 1/2012 | Gosset et al. |
| 8,313,631 B2 | 11/2012 | McHugh et al. |
| 8,420,015 B2 | 4/2013 | Ganesan et al. |
| 8,581,392 B2 | 11/2013 | Knickerbocker et al. |
| 8,652,763 B2 | 2/2014 | Jain et al. |
| 8,734,631 B2 | 5/2014 | Ahrens et al. |
| 8,734,904 B2 | 5/2014 | Cheng et al. |
| 8,734,968 B2 | 5/2014 | Chae et al. |
| 8,735,055 B2 | 5/2014 | Breidenthal et al. |
| 8,735,797 B2 | 5/2014 | Yu et al. |
| 8,741,737 B2 | 6/2014 | Popa et al. |
| 8,742,398 B2 | 6/2014 | Klem et al. |
| 8,742,469 B2 | 6/2014 | Milgrew |
| 8,742,472 B2 | 6/2014 | Rothberg et al. |
| 2011/0031633 A1 | 2/2011 | Hsu et al. |
| 2012/0323008 A1 | 12/2012 | Barry et al. |
| 2013/0075265 A1 | 3/2013 | McHugh et al. |
| 2013/0217102 A1 | 8/2013 | Ganesan et al. |
| 2014/0043757 A1 | 2/2014 | Bernstein et al. |
| 2014/0134404 A1 | 5/2014 | Jain et al. |
| 2014/0140020 A1 | 5/2014 | Rogers et al. |
| 2014/0141460 A1 | 5/2014 | Eckhardt |
| 2014/0147346 A1 | 5/2014 | Chitnis et al. |
| 2014/0147627 A1 | 5/2014 | Aizenberg et al. |
| 2014/0301039 A1 | 10/2014 | Otremba et al. |

FOREIGN PATENT DOCUMENTS

| | | |
|---|---|---|
| JP | 5502275 B2 | 5/2014 |
| JP | 5503095 B1 | 5/2014 |
| JP | 2014098700 A | 5/2014 |
| JP | 2014512839 A | 5/2014 |
| WO | 2010107302 A2 | 9/2010 |
| WO | 2012115635 A1 | 8/2012 |
| WO | 2012155264 A1 | 11/2012 |

OTHER PUBLICATIONS

Töral et al., "Pin-Shape Assessment for Interlayer-Cooled Chip Stacks with Periodic Boundary Condition Modeling", Thermal Investigations of ICs and Systems (THERMINIC), 2010 16th International Workshop, Oct. 6-8, 2010, 10 pages.

IBM: List of IBM Patents or Patent Applications Treated As Related (Appendix P), Jun. 16, 2016, pp. 1-2.

Clevenger et al., Pending U.S. Appl. No. 14/574,551, filed Dec. 18, 2014, titled "Integrated Circuit Barrierless Microfluidic Channel,", pp. 1-28.

Pending U.S. Appl. No. 15/067,267, filed Mar. 11, 2016, titled "Integrated Circuit Barrierless Microfluidic Channel,", pp. 1-28.

INTEGRATED CIRCUIT BARRIERLESS MICROFLUIDIC CHANNEL

The present invention relates generally to integrated circuits (IC), and more particularly, to a structure and method for cooling an IC by fabricating a continuous channel, free of horizontal barrier layers, throughout the wiring levels of the IC that is capable of circulating cooling fluid.

BACKGROUND

High performance IC chips dissipate energy at a high power density and require cooling to maintain the operating temperature within a specified range. Ineffective cooling may lead to an increased junction leakage, reduced operability, and, in extreme cases, operating failures.

Cooling methods typically involve placement of radiant fins, heat sinks, or fans at a surface of the microprocessor or its package. These traditional cooling methods, which are generally remote from the sources of heat generation within the microprocessor, are increasingly becoming inadequate as the functionality per chip continues to increase. Thus, more effective cooling techniques are required.

SUMMARY

According to an embodiment, a method is provided. The method may include forming a continuous cooling channel in a back end of the line (BEOL) of an integrated circuit (IC) chip by providing a first interconnect level having a first conductive filler layer; forming a second interconnect level on the first interconnect level; forming a pairs of openings in the second interconnect level to expose the first conductive filler layer; lining each of the openings with a barrier layer; removing a horizontal portion of a barrier layer from each of the openings using gas cluster ion beam etching to expose an upper surface of the first conductive filler layer wherein a vertical portion of the barrier layer located on a sidewall of each of the openings remains intact; filling the openings with a second conductive filler layer, wherein the second conductive filler layer in each of the openings is in contact with the first conductive filler layer; and, removing the second conductive filler layer from each of the opening and removing the first conductive filler layer to form a continuous cooling channel.

In another embodiment, a structure is provided. The structure may include an integrated circuit chip having a continuous cooling channel extending through back end of the line (BEOL) of the chip with a pair of vertical channel openings extending through two or more dielectric layers in the back end of line of the chip wherein each vertical channel opening has a bottom; a horizontal channel opening connecting the pair of vertical channel openings at their bottoms; and a barrier layer having a vertical portion on a sidewall of each of the vertical channel openings and a horizontal portion, wherein the horizontal portion of the barrier layer extends laterally into each of the vertical channel openings at a location where the dielectric layers meet, and wherein the horizontal portion extends only partially into the vertical channel opening such that a sidewall of the horizontal portion of the barrier layer is exposed.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which not all structures may be shown.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

In the following description, numerous specific details are set forth, such as particular structures, components, materials, dimensions, processing steps, and techniques, in order to provide a thorough understanding of the present invention. However, it will be appreciated by one of ordinary skill of the art that the invention may be practiced without these specific details. In other instances, well-known structures or processing steps have not been described in detail in order to avoid obscuring the invention. It will be understood that when an element as a layer, region, or substrate is referred to as being "on" or "over" another element, it can be directly on the other element or intervening elements may also be present. In contrast, when an element is referred to as being "directly on" or "directly" over another element, there are no intervening elements present. It will also be understood that when an element is referred to as being "beneath," "below," or "under" another element, it can be directly beneath or under the other element, or intervening elements may be present. In contrast, when an element is referred to as being "directly beneath" or "directly under" another element, there are no intervening elements present.

Embodiments of the present invention relate generally to integrated circuits, and more particularly to a structure and method for fabricating a continuous microfluidic cooling channel in the back end of line (BEOL) wiring region of an integrated circuit (IC) chip that may be used for heat dissipation. This continuous cooling channel may extend through the wiring levels of the IC chip as opposed to the exterior surface of a chip of the chip package. The continuous cooling channel may be formed through one or more interconnect levels, forming one continuous pathway to allow for the circulation of cooling fluid to the lower levels of the IC. Embodiments by which to fabricate such continuous cooling channels are described in detail below with reference to the accompanying drawings FIGS. 1-11.

Figure 1:
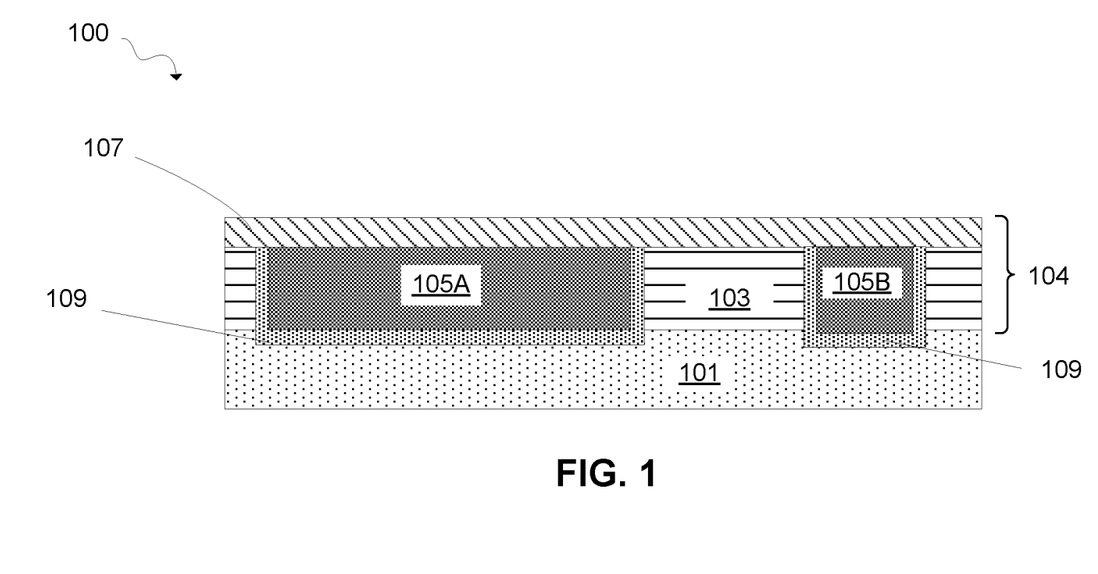
FIG. 1 is a cross section view illustrating a preliminary structure with a first interconnect level, according to an embodiment of the present invention.

Referring now to FIG. 1, a cross section view of a preliminary structure 100 that may be used as a starting point of the fabrication of the continuous cooling channel is shown. The preliminary structure 100 may include a first interconnect level 104 formed on a substrate 101. The first interconnect level 104 may include a first dielectric layer 103 formed on the substrate and conductive features 105A and 105B embedded therein. A capping layer 107 may be formed on the first dielectric layer 103. In an embodiment, the first interconnect level 104 may be a first wiring level ($M_x$) of the back end of the line (BEOL) wiring of an IC.

In an embodiment, the substrate 101 may be a bulk substrate. In another embodiment, the substrate 101 may be a semiconductor on insulator (SOI) substrate. The substrate 110 may be made of any semiconductor material typically known in the art, including, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide.

The first dielectric layer 103 may be composed of any interlevel or intralevel dielectric material, including inorganic dielectrics and organic dielectrics. The first dielectric layer 103 may be porous or non-porous, with porous dielectrics having a dielectric constant of about 2.8 or less being preferred in some embodiments of the present invention. In an embodiment, the first dielectric layer 103 may have a dielectric constant that is about 4.0 or less. These dielectrics generally have a lower parasitic crosstalk as compared with dielectric materials that have a dielectric constant higher than 4.0.

Some examples of suitable dielectrics that may be used to form the first dielectric layer 103 include, but are not limited to $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like. The thickness of the first dielectric layer 103 may vary depending upon the dielectric material used. In an embodiment, the first dielectric layer 103 may have a thickness ranging from approximately 200 nm to approximately 450 nm.

The conductive features 105A and 105B may be formed by depositing a barrier layer 109 followed by a conductive material in openings (not shown) formed in the first dielectric layer 103. The barrier layer 109 may be composed of Ta, TaN, Ti, TiN, Ru, RuN, W, WN or any other material that can serve as a barrier to prevent diffusion of conductive material. The barrier layer 109 may be formed using a conventional deposition process such as, for example, atomic layer deposition (ALD), chemical vapor deposition (CVD), plasma enhanced chemical vapor deposition (PECVD), physical vapor deposition (PVD), sputtering, chemical solution deposition, or plating. The thickness of the barrier layer 109 may vary depending on the exact means of the deposition process as well as the material employed. In an embodiment, the barrier layer 109 may have a thickness ranging from approximately 4 nm to approximately 40 nm, with a thickness ranging from approximately 7 nm to approximately 20 nm being preferred.

The conductive material may be composed of, for example, polySi, a conductive metal, a conductive metal silicide, or combinations thereof. In a preferred embodiment, the conductive material may be a conductive metal such as Cu, W, Al, or alloys thereof. The conductive material may be deposited on the barrier layer 109 using a conventional deposition process including, but not limited to CVD, PECVD, sputtering, chemical solution deposition, or plating. After the conductive material is deposited, a conventional planarization process such as, for example, chemical mechanical polishing (CMP) may be performed so that the conductive features 105A and 105B, each have an upper surface that is substantially coplanar with the upper surface of the first dielectric layer 103. In an embodiment, the conductive features 105A and 105B may extend into the substrate 101.

The capping layer 107 may be formed on the first dielectric layer 103 and the conductive features 105A and 105B. The capping layer 107 may be composed of any suitable dielectric capping material such as, for example, SiC, $Si_4NH_3$, a nitrogen and hydrogen doped silicon carbide SiC(N,H) or multilayers thereof. The capping layer 107 may be formed using a conventional deposition process such as, for example, CVD, PECVD, chemical solution deposition, or evaporation. The thickness of the dielectric capping layer 107 may vary depending on the technique used to form the same as well as the material make-up of the layer. In an embodiment, the dielectric capping layer 107 may have a thickness ranging from approximately 15 nm to approximately 55 nm, with a thickness ranging from approximately 25 nm to approximately 45 nm being preferred.

Figure 2:
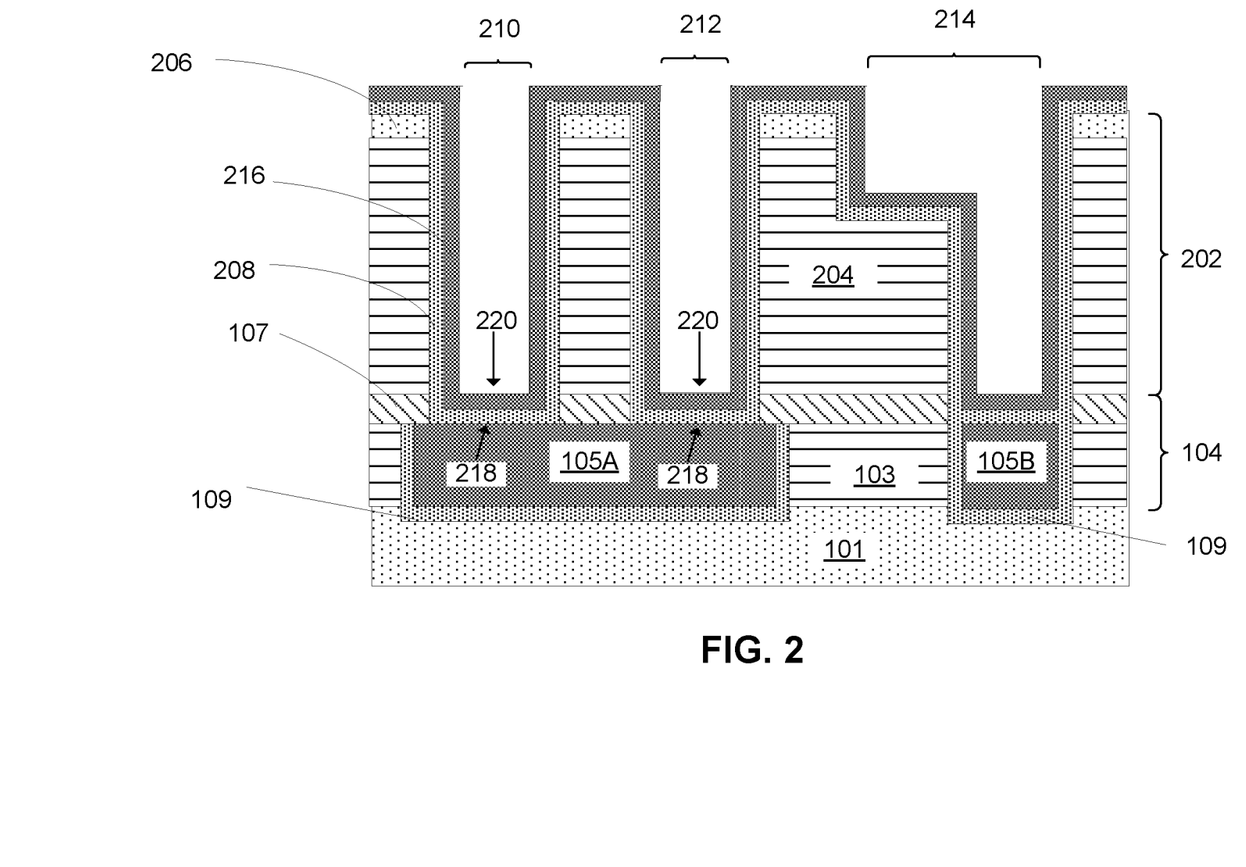
FIG. 2 is a cross section view illustrating forming a second interconnect level on the first interconnect level, according to an embodiment of the present invention.

Referring now to FIG. 2, a cross section view illustrating forming a second interconnect level 202 is shown. The second interconnect level 202 may be formed on the first interconnect level 104. The second interconnect level 202 may include a second dielectric layer 204 on the capping layer 107 and a sacrificial layer 206 formed thereon.

The second dielectric layer 204 may be composed of the same or different dielectric material as that of the first dielectric layer 103 and may be formed using substantially similar techniques as those used described above with reference to formation of the first dielectric layer 103 in FIG. 1. The sacrificial layer 206 may be composed of an insulating material, such as SiCOH, SiCNH, SiCFH, or combinations thereof. The sacrificial layer 206 may be formed by a conventional deposition process, such as, for example chemical vapor deposition (CVD) or metal organic chemical vapor deposition (MOCVD). In an embodiment, the sacrificial layer 206 may have a dielectric constant of less than 3.9, which is the dielectric constant of undoped silicon oxide. In another embodiment, the sacrificial layer 206 may have a dielectric constant of less than 3.0. The sacrificial layer 206 may be porous or non-porous.

In an embodiment, one or more openings 210, 212, and 214 may be formed in the second interconnect level 202 and the capping layer 107 to expose an upper surface of the conductive features 105A and 105B. The openings 210, 212, and 214 may be formed using conventional techniques such as photolithography and etching. In an embodiment, a blanket hard mask material (not shown) may be formed on an upper surface of the sacrificial layer 108. The blanket hard mask layer may be composed of an oxide, nitride, oxynitride or any combination including multilayers thereof. The blanket hard mask layer may be formed using a conventional deposition process such as, for example, CVD, PECVD, chemical solution deposition, or evaporation. In an embodiment, the openings 210 and 212 and the conductive feature 105A may be used to form a continuous interconnect channel described below. The opening 214 may be used to form a conventional electrical interconnect.

In an embodiment, a barrier layer 208 may be deposited in the openings 210, 212, and 214 and on the sacrificial layer 206. The barrier layer 208 may be in contact with an upper surface of the conductive features 105A and 105B, the capping layer 107, the second dielectric layer 204, and the sacrificial layer 206. The barrier layer 208 may have a horizontal portion 218 on the upper surface of the conductive feature 105A at an intermediate portion of the BEOL wiring. The barrier layer 208 may be composed of Ta, TaN, Ti, TiN, Ru, RuN, W, WN or any other material that can serve as a barrier to prevent diffusion of conductive material. In an embodiment, the barrier layer 208 may be composed of the same material as the barrier layer 109. The barrier layer 208 may be formed by a conventional deposition process such as, for example, atomic layer deposition (ALD), chemical vapor deposition (CVD), plasma enhanced chemical vapor deposition (PECVD), physical vapor deposition (PVD), sputtering, chemical solution deposition, or plating.

The thickness of the barrier layer 208 may vary depending on the exact means of the deposition process as well as the material employed. In an embodiment, the barrier layer 208 may have a thickness ranging from approximately 3 nm to approximately 100 nm, although lesser and greater thicknesses can also be employed. In an embodiment in which the barrier layer 208 is formed by conformal deposition, the thickness of the barrier layer 208 may be constant through the horizontal portions and the vertical portions of the openings 210, 212, and 214. In an embodiment in which the barrier layer 208 is formed by a non-conformal deposition process, the thickness of vertical or tapered portions of the barrier layer 208 may be less than the thickness of the horizontal portions of the barrier layer 208.

In an embodiment, a seed layer 216 may be formed on the barrier layer 208. The seed layer 216 may have a horizontal portion 220 on an upper surface of the horizontal portion of the barrier layer 208. The seed layer 216 may be composed of a metal or metal alloy. In an embodiment, the seed layer 216 may be composed of an element from Group VIIIA of the Periodic Table of Elements such as Ru, Ir, Rh, Pt, Pd and alloys thereof. In another embodiment, the metallic seed layer 216 may be composed of Cu, Ru, Ir or Rh. In an embodiment, the metallic seed layer 216 may be deposited by a conventional non-conformal deposition process, such as, for example, physical vapor deposition (PVD), depletive chemical vapor deposition (CVD), atomic layer deposition (ALD), vacuum evaporation, or a combination thereof. In another embodiment, the metallic seed layer 216 may be deposited by a conformal deposition process such as non-depletive chemical vapor deposition. The thickness of the metallic seed layer 216 may range from approximately 3 nm to approximately 100 nm, although lesser and greater thicknesses can also be employed.

Figure 3:
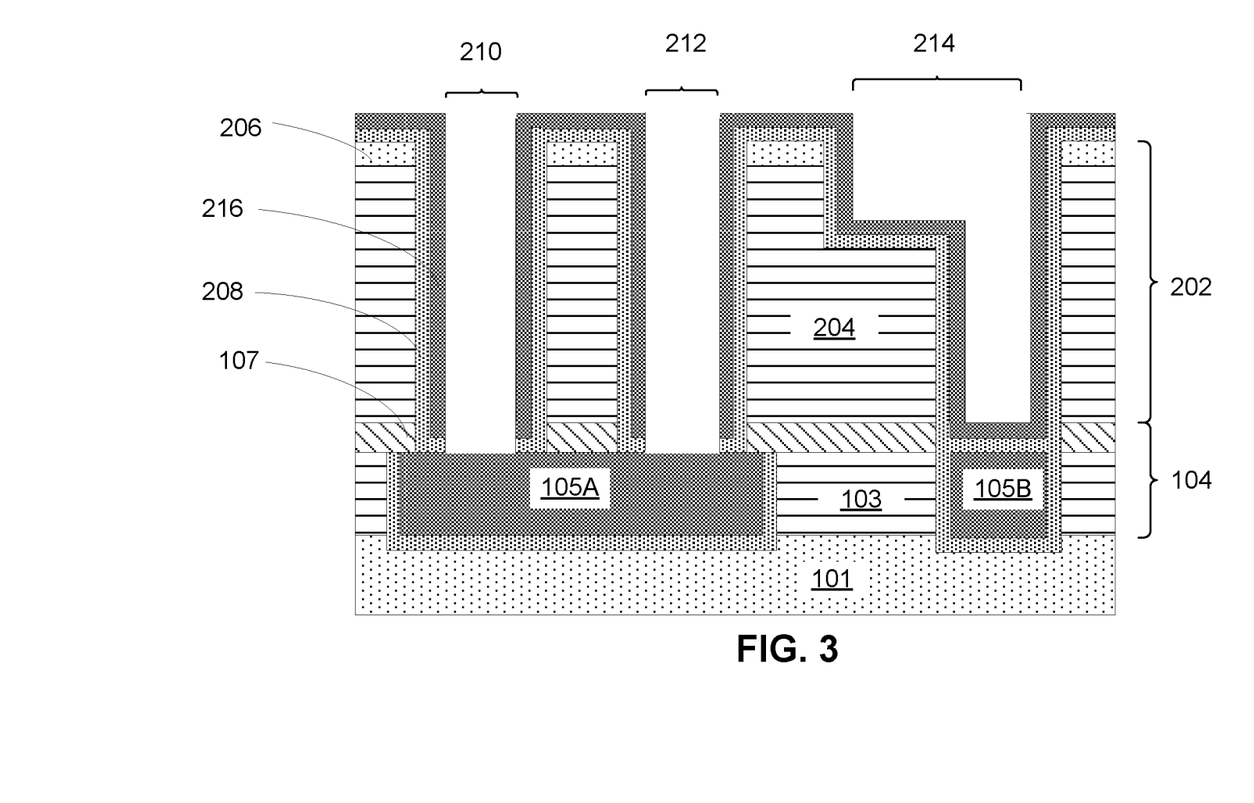
FIG. 3 is a cross section view illustrating removing a horizontal portion of a barrier layer and a horizontal portion of a seed layer, according to an embodiment of the present invention.

Referring now to FIG. 3, a cross section view illustrating removing at least part of the horizontal portion 218 (FIG. 2) of the barrier layer 208 and the horizontal portion 220 (FIG. 2) of the seed layer 216 is shown. In an embodiment, vertical portions of the barrier layer 208 and the seed layer 216 may remain intact. The horizontal portions 218 of the barrier layer 208 and the horizontal portion 220 of the seed layer 216 may be removed using a focused ion beam source such as gas cluster ion beam (GCIB) etching. After the removal, the openings 210 and 212 may extend continuously down to the upper surface of the conductive feature 105A. Because the GCIB process using a focused beam having a width less than a width of the openings 210 and 212, the opening 214 does not need to be masked for protection, though could be if desired. It should be noted that although FIG. 3 depicts the removal of the horizontal portion 218 of the barrier layer 208 and the horizontal portion 220 of the seed layer 216 above only the conductive feature 105A, embodiments are considered in which the horizontal portions of the barrier layer 208 and the seed layer 216 are removed in the opening 214 as well. In such an embodiment, the opening 214 may be filled with a conductive material to form an electrical interconnect having no barrier layer 208 between layers, which may reduce electrical resistance.

During the focused GCIB etching, the horizontal portions 218 of the barrier layer 208 and the horizontal portions 220 of the seed layer 216 may be bombarded by a focused beam of high energy, gas phase atomic clusters. The clusters may be formed when a high pressure gas, at a pressure of approximately 10 atmospheres, supersonically expands into a vacuum, at a pressure of approximately $1 \times 10^{-5}$ Torr, cools, and then condenses into weakly ionized clusters. The ionized clusters may be accelerated electrostatically to very high velocities, and may be focused into a tight beam that impacts each of the horizontal portions 220 of the seed layer 216 and the horizontal bottom portions 218 of the barrier layer 208. As opposed to a more dispersed ion implant process, atoms of a cluster ion impact interact nearly simultaneously with the surface atoms, which may produce results such as surface smoothing, pore sealing, shallow cratering, surface chemistry alterations, thin film deposition, and shallow implantation or infusing, depending upon whether the gas clusters are inert or reactive.

The focused GCIB may include chemical beams of almost any species or mixture, depending on the specific objectives of the processing. Exemplary beams may include, for example, silicon (Si), nitrogen (N) or carbon (C) for film deposition, fluorine (F) for etching, and argon (Ar), N, C, or oxygen (O) for surface modification. In an embodiment, a silicon species may be used in the GCIB etching to form a GCIB layer (not shown). In addition to being a low temperature (e.g., room temperature) infusion process, the GCIB layer may have a relatively shallow thickness, on the order of approximately 10 nm or less, that can easily be removed selective to the seed layer 216 and the barrier layer 208. By way of illustration, focused GCIB etching can be performed utilizing the following non-limiting conditions: gas flow of approximately 20 sccm Ar, temperature of approximately 25° C., bias of top electrode of approximately 400 KHz and 750 W, table bias of approximately 13.6 MHz and 400 W, and a process pressure of approximately 0.6 mtorr. While Ar is mentioned for illustration purposes, any other gas such as He, Ne, Xe, $N_2$, $H_2$, $NH_3$, $N_2H_2$, or mixtures thereof, can also be used for the sputtering process.

Figure 4:
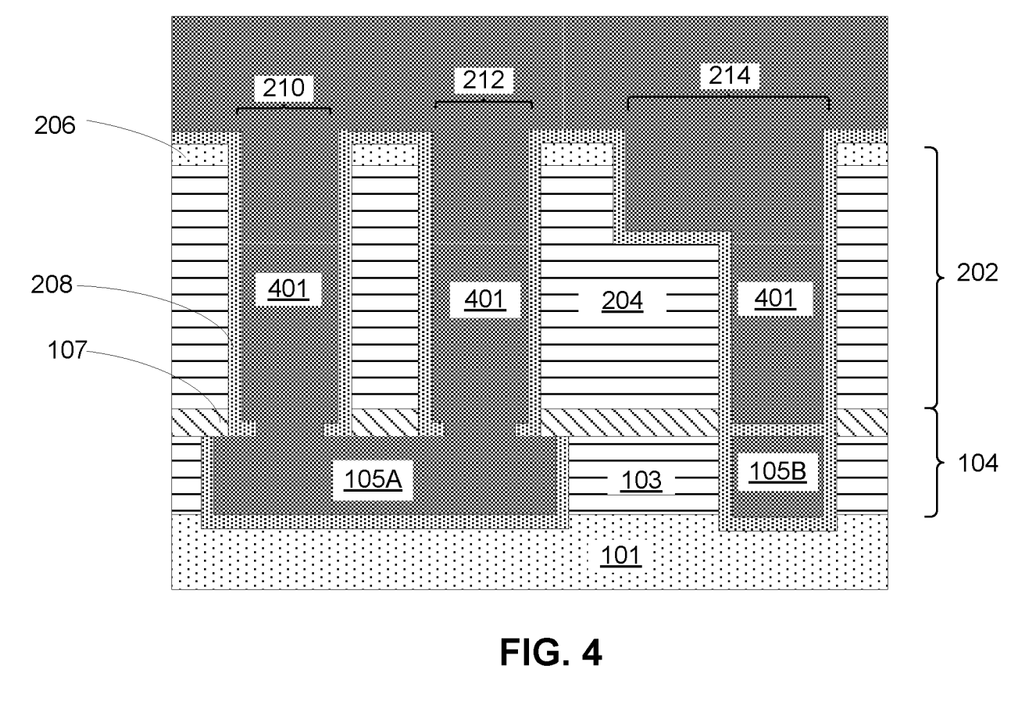
FIG. 4 is a cross section view illustrating depositing a conductive filler in openings formed in the second interconnect level, according to an embodiment of the present invention.

Referring now to FIG. 4, a cross section view illustrating depositing a conductive filler 401 in the openings 210, 212, and 214 is shown. In an embodiment, the conductive filler 401 may be composed of a metallic material, such as W, Al, Cu, or alloys thereof. The conductive filler 401 may be deposited on the seed layer 216 (FIG. 3) and may be composed of the same material. In a preferred embodiment, the conductive filler 401 may be composed of substantially similar materials as the conductive features 105A and 105B. The conductive filler 401 may be deposited by any method known in the art including, but not limited to, physical vapor deposition (PVD), chemical vapor deposition (CVD), electroplating, electroless plating, and combinations thereof. In an embodiment, the conductive filler 401 may extend above an upper surface of the second interconnect level 202. Because the horizontal portions 216 of the barrier layer 208 and the horizontal portions 220 of the seed layer 216 were removed, the conductive filler 401 may be in direct contact with the upper surface of the conductive feature 105A, forming one continuous portion.

Figure 5:
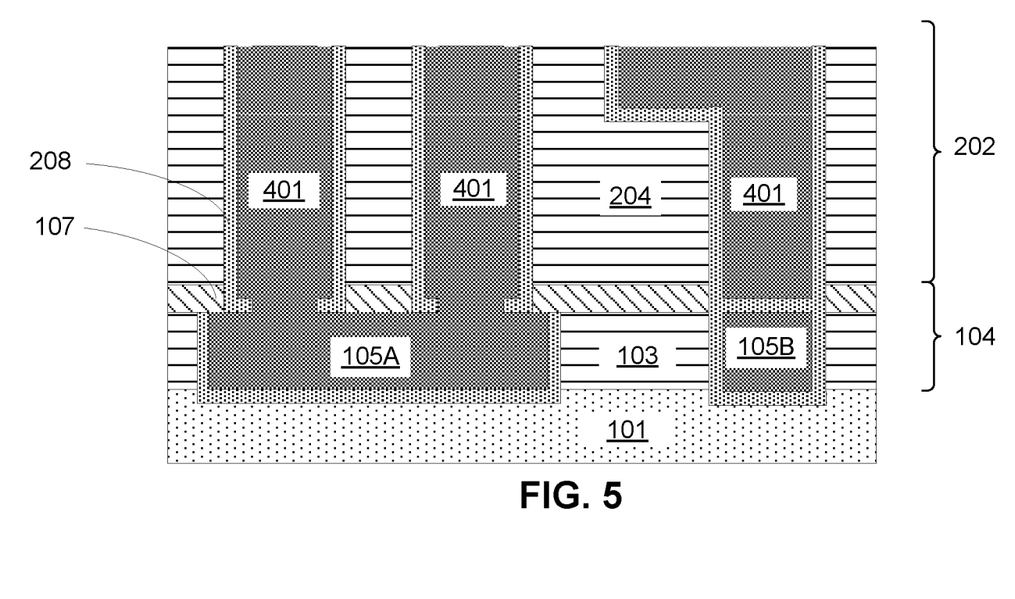
FIG. 5 is a cross section view illustrating removing portions of the conductive filler, the barrier layer, and the sacrificial layer above an upper surface of the second dielectric layer, according to an embodiment of the present invention.

Referring now to FIG. 5, a cross section view illustrating removing portions of the conductive filler 401, the barrier layer 208, and the sacrificial layer 206 above the upper surface of the second dielectric layer 204 is shown. In an embodiment, the portions of the conductive filler 401, the barrier layer 208, and the sacrificial layer 206 may be removed using a conventional planarization technique, such as, chemical mechanical planarization (CMP). After the removal, an upper surface of the conductive filler 401 and an upper surface of the barrier layer 208 may be substantially flush with the upper surface of the second dielectric layer 204.

Figure 6:
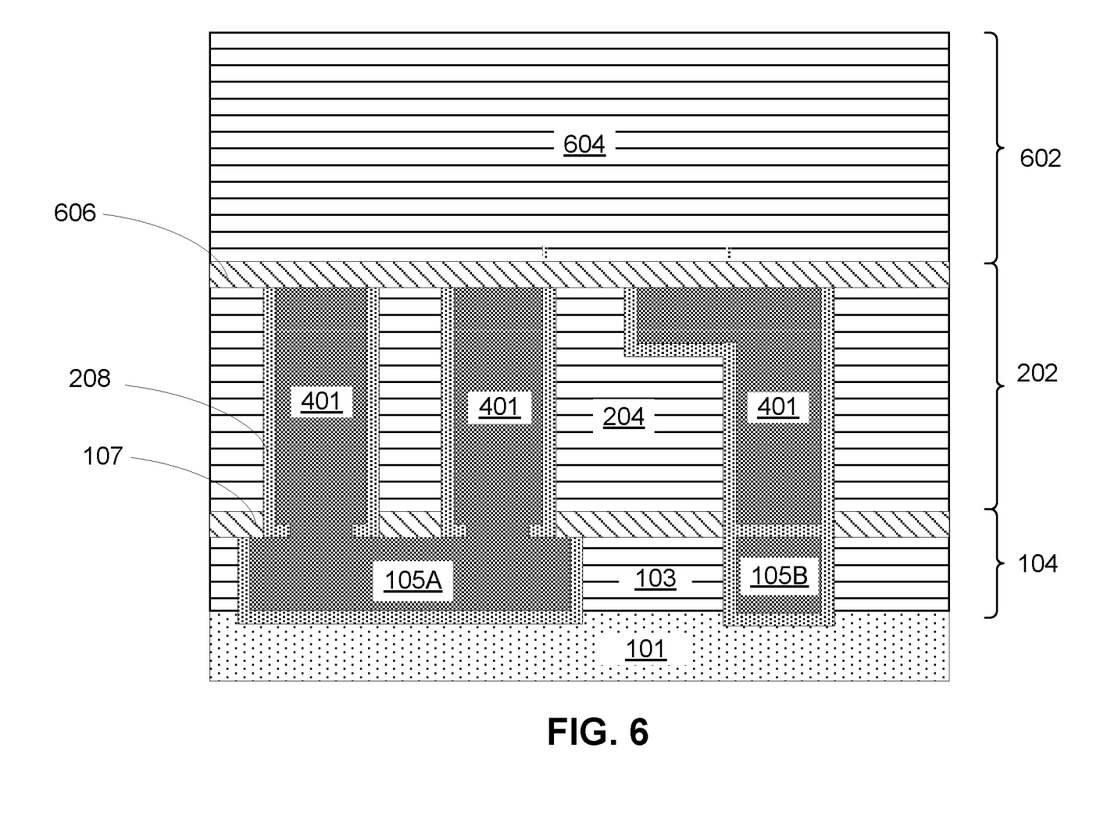
FIG. 6 is a cross section view illustrating forming a capping layer and a third interconnect level over the second interconnect level, according to an embodiment of the present invention.

Referring now to FIG. 6, a cross section view illustrating forming a capping layer 606 and a third interconnect level 602 over the second interconnect level 202 is shown. The capping layer 606 may be substantially similar to the capping layer 107 and may formed using substantially similar techniques as those described above with reference to FIG. 1. The capping layer 606 may be formed on the upper surface of the second dielectric 204, the upper surface of the barrier layer 208, and the upper surface of the conductive filler 401. The third interconnect level 602 may include a third dielectric layer 604 formed on the capping layer 606. The third dielectric layer 604 may be substantially similar to the second dielectric layer 204 and may formed using substantially similar techniques as those described above with reference to FIG. 2.

Figure 7:
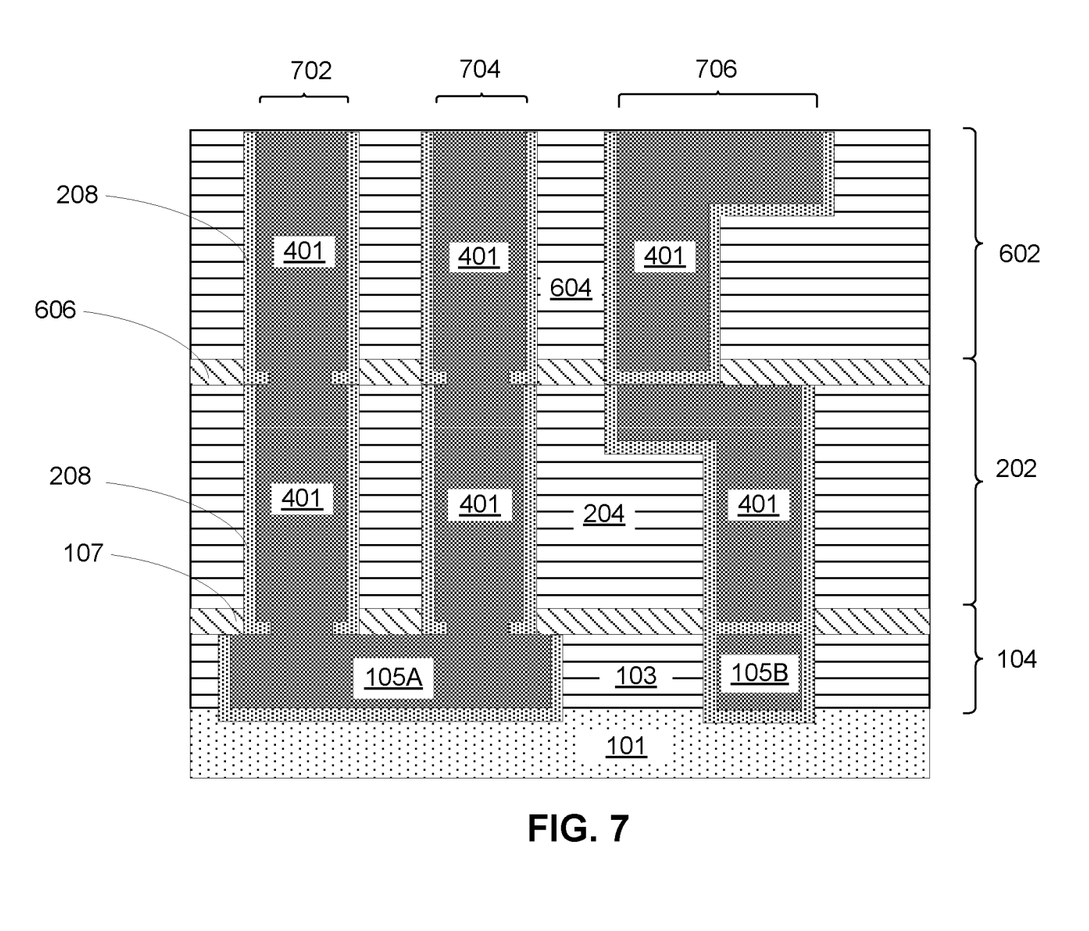
FIG. 7 is a cross section illustrating repeating the steps described above with reference to FIGS. 2-6 in the third interconnect level, according to an embodiment of the present invention.

Referring now to FIG. 7, a cross section view illustrating repeating the steps described above with reference to FIGS. 2-6 in the third interconnect level 602 is shown. In an embodiment, openings (not shown) may be formed in the third dielectric layer 604 and the capping layer 606 to expose the upper surface of the conductive filler 401. The barrier layer 208 may be deposited in the openings and the seed layer (FIG. 2) may be formed on the barrier layer 208. The GCIB etching process described above with reference to FIG. 3 may be repeated to remove horizontal portions (not shown) of the barrier layer 208 and the seed layer at another intermediate portion of the BEOL wiring. The GCIB etching may expose the upper surface of the conductive filler 401 in the second interconnect level 202 above the conductive feature 105A. It should be noted that embodiments are considered in which the GCIB etching process is performed so as to expose an upper surface of the conductive filler 401 in the second interconnect level 202 above the conductive feature 105B as well. The openings may then be filled with additional conductive filler 401 as described above with reference to FIG. 4. In an embodiment, a planarization process may then be performed such that an upper surface of the filler material 401 is substantially flush with an upper surface of the third dielectric layer 604.

Depositing the conductive filler 401 in the openings may form channel stacks 702 and 704 and an electrical interconnect 706. Because the horizontal portions 216 (FIG. 2) of the seed layer at the bottom of the second interconnect level 202 and the horizontal portions of the barrier layer 208 at the bottom of the third interconnect level 602 have been removed using the GCIB etching process, the channel stacks 702 and 704 may contain one continuous portion of the conductive filler 401 that extends continuously down to the upper surface of the conductive feature 105A. In other words, the conductive filler 401 may extend through an entire height of the channel stacks 702 and 704 with no horizontal portions of the barrier layer 208 remaining across a width of them between different interconnect levels.

The above steps may be repeated to develop several similar additional interconnect levels of via/line patterns that are stacked directly above and contiguous with any previously formed underlying via/line interconnect level. The resulting structure may include several levels of integrated conductive via/line openings filled with a conductive filler that is continuous throughout the entire height of the via/line openings (i.e., with no horizontal portions of the barrier layer across a width of the via/line openings).

Figure 8:
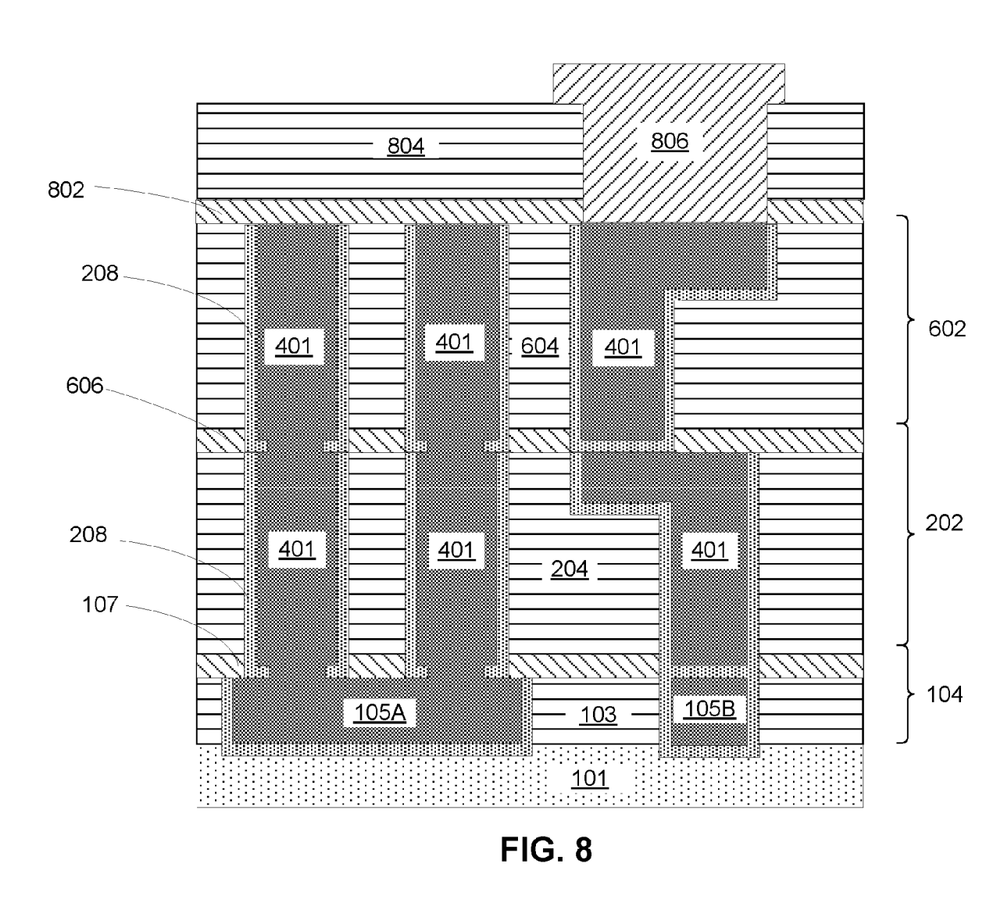
FIG. 8 is a cross section view illustrating forming an upper dielectric layer on the third interconnect level and an electrical contact on an electrical interconnect, according to an embodiment of the present invention.

Referring now to FIG. 8, a cross section view illustrating forming an upper dielectric layer 804 on the third interconnect level 602 and an electrical contact 806 on the electrical interconnect 706 (FIG. 7) is shown. In an embodiment, a capping layer 802 may be formed on an upper surface of the third dielectric layer 604, the conductive filler 401, and the barrier layer 208. The capping layer 802 may be substantially similar to the dielectric capping layer 107 and may be formed using substantially similar techniques as those described above with reference to FIG. 1. The upper dielectric layer 804 may be substantially similar to the second dielectric layer 204 and may be formed using substantially similar techniques as those described above with reference to FIG. 2.

In an embodiment, the upper dielectric layer 804 and the capping layer 802 may be patterned and etched using conventional techniques to form an opening (not shown) above the electrical interconnect 706 (FIG. 7). The opening may expose the conductive filler 401 in the electrical interconnect 706 (FIG. 7). The electrical contact 806 may then be formed in the opening. In an embodiment, the electrical contact 806 may be composed of a plurality of metallic layers in which the outermost layer contains Al or an alloy of Al. Examples of suitable compositions that may be used for the electrical contact 806 include, but are not limited to, Ti/TiN/AlCu, Ti/AlCu/TiN, Ti/Al/TiN, Ti/Al/TiN, Ti/TiN/AlCuSi/TiN, Ti/AlCuSi, and alloys thereof. The electrical contact 806 may be formed utilizing any of the deposition techniques known in the art, such as, for example, atomic layer deposition (ALD), plating, or sputtering. The electrical contact 806 may also serve as a protective etch stop for the conductive filler 401 in the electrical interconnect 706 during subsequent processing steps used to form the continuous cooling channels described below.

Figure 9:
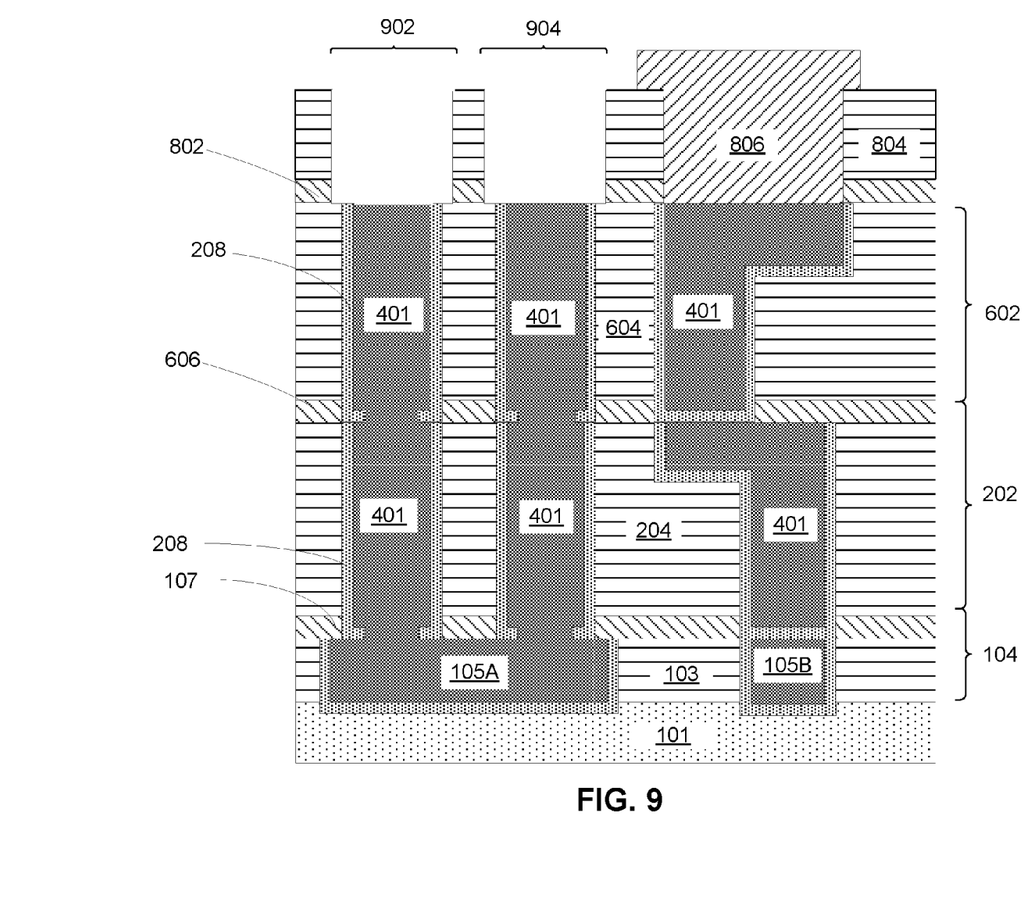
FIG. 9 is a cross section view illustrating forming terminal openings in the upper dielectric layer and the capping layer, according to an embodiment of the present invention.

Referring now to FIG. 9, a cross section view illustrating forming terminal openings 902 and 904 in the upper dielectric layer 804 and the capping layer 802 is shown. In an embodiment, the terminal openings 902 and 904 may expose the conductive filler 401 in the channel stacks 702 and 704 (FIG. 7). The terminal openings 902 and 904 may be formed by removing portions of the upper dielectric layer 804 and the capping layer 802 using standard lithographic techniques well known to those skilled in the art including lithography and a dry etch process such as RIE or a wet chemical etch process.

Figure 10:
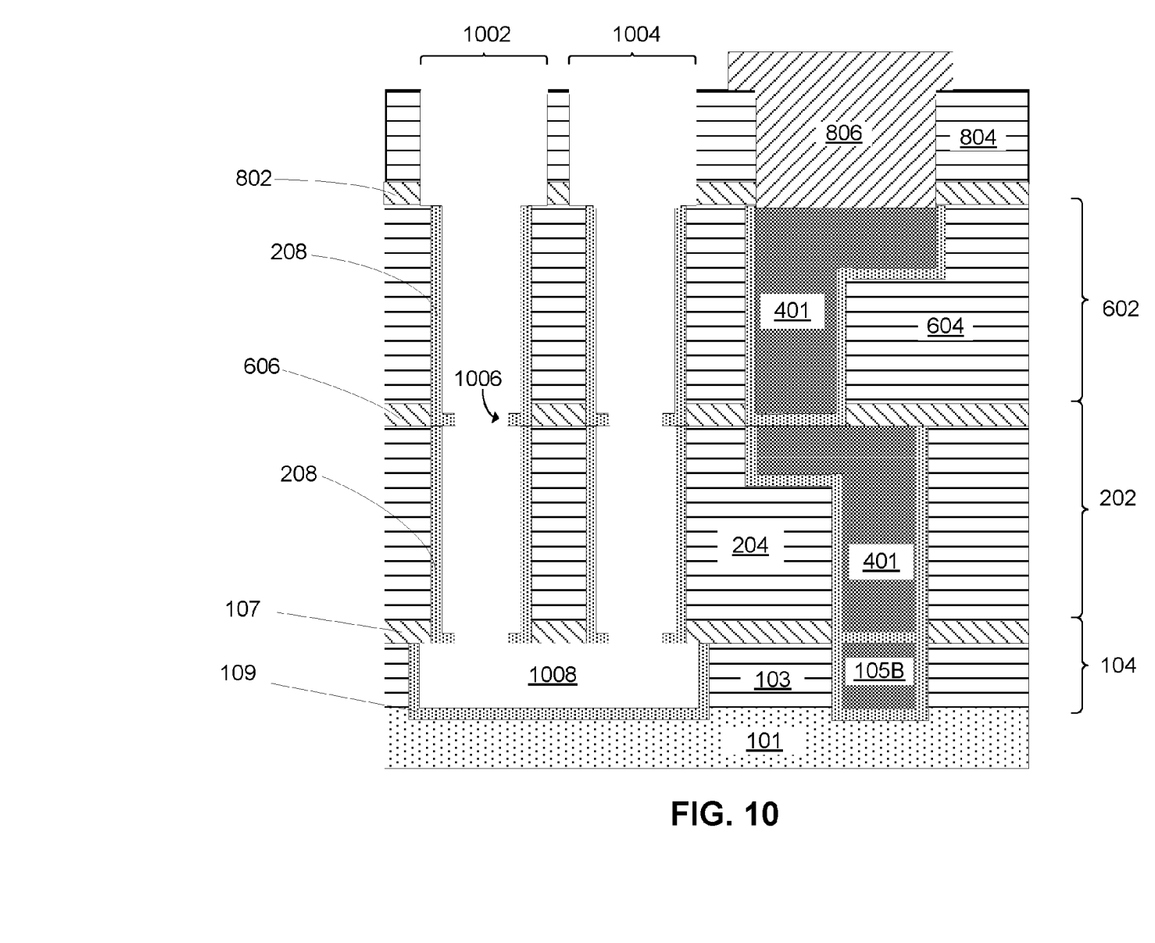
FIG. 10 is a cross section view illustrating forming continuous cooling channels, according to an embodiment of the present invention.

Referring now to FIG. 10, a cross section view illustrating forming a pair of vertical cooling channels 1002 and 1004 connected by horizontal cooling channel 1008 at their bottoms to form a continuous cooling channel is shown. In an embodiment, the pair of vertical cooling channels 1002 and 1004 and horizontal cooling channel 1008 may be formed by removing the conductive filler 401 in the channel stacks 702 and 704 (FIG. 7) and the conductive feature 105A (FIG. 9), respectively. In an embodiment, substantially all of the conductive filler 401 in the channel stacks 702 and 704 (FIG. 7) and in the conductive feature 105A may be removed selective to the barrier layer 208, the capping layer 802, the upper dielectric layer 804, and the electrical contact 806 using a wet etch process. As described above, the contact 806 may completely cover the conductive filler 401 in the electrical interconnect 706 (FIG. 7) and protect it from removal. Because of the removal of the bottom horizontal portions of the barrier layer 208 between interconnect levels during the GCIB etching, the continuous microfluidic cooling channel may extend from an upper surface of the upper dielectric layer 804 all the way to an upper surface of the barrier layer 208 in the conductive feature 105A. The resulting structure is a continuous channel that extends through the interconnect levels. At the interconnect levels, the vertical channels are barrier material while the horizontal channel has sidewalls and a bottom lined with barrier material while the top portion of the horizontal channel may be lines with a capping layer 107 or a combination of capping layer 107 and barrier material, and preferably the horizontal portion of barrier material 208.

Because the conductive filler 401 is removed selective to the barrier layer 208, portions of the barrier layer 208 may remain in the continuous cooling channels 1002 and 1004. A vertical portion of the barrier layer 208 may remain on a sidewall of the continuous cooling channels 1002 and 1004. A portion 1006 of the barrier layer 208, having a width that is approximately equivalent to a width of the seed layer 216 (FIG. 2) may extend laterally into the continuous cooling channels 1002 and 1004. However, the portion 1006 may not extend across an entire width of the channels 1002 and 1004, such that a sidewall of the portion 1006 of is exposed in the channel openings 1002 and 1004.

Figure 11:
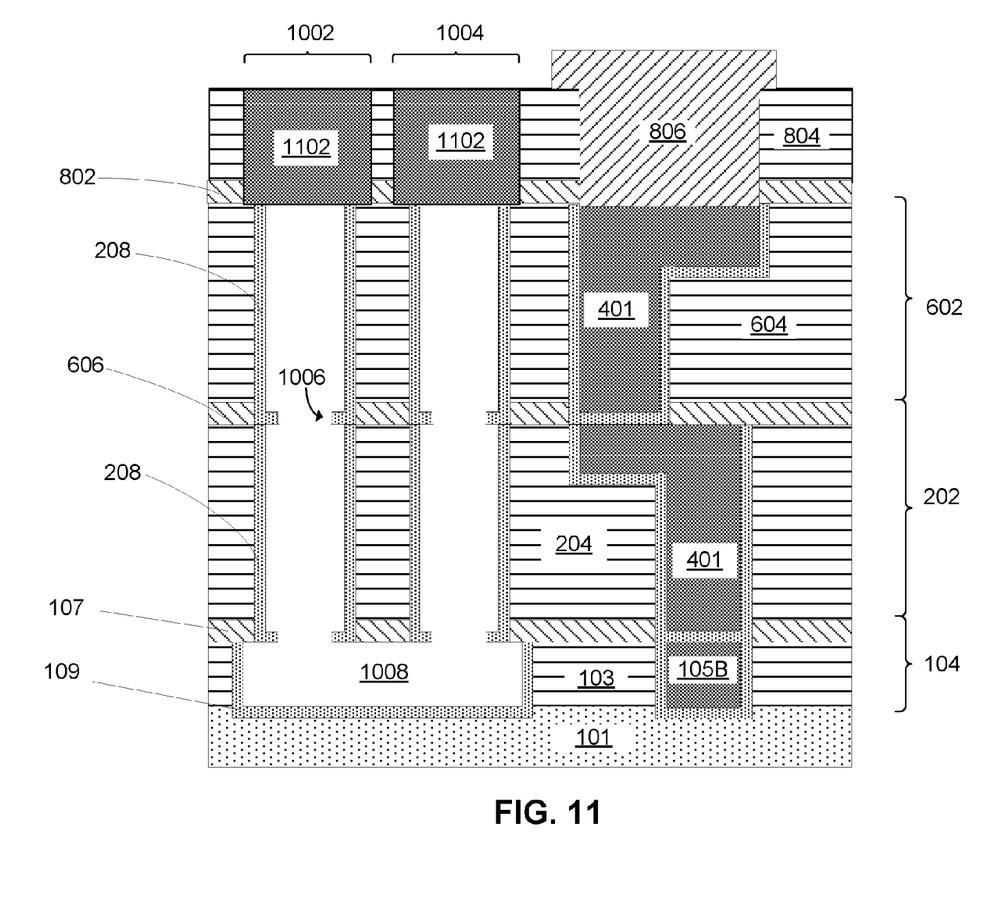
FIG. 11 is a cross section view illustrating forming plugs 1102 in an upper portion of the continuous cooling channels, according to an embodiment of the present invention.

Referring now to FIG. 11, a cross section view illustrating forming plugs 1102 in an upper portion of the continuous cooling channels 1002 and 1004 is shown. In an embodiment, the plug may be formed to seal off the continuous cooling channels 1002 and 1004 during subsequent processing. The plugs 1102 may be composed of a dielectric material or a metal and may be formed using conventional techniques known in the art. In an embodiment, the plugs 1102 may be subsequently removed to restore access to the continuous cooling channels 1002 and 1004.

The fabrication of a continuous cooling channel in the back end of line of an IC may provide a path for a cooling fluid pumped from an external fluidic-cooling circulation driver to make physical contact with multiple wiring levels within the IC chip to provide more efficient cooling. Such superior heat dissipation, in turn, may lead to longer operating life for an IC device, as well as to better performance of the IC during the device's operating life resulting from better operability, for e.g., due to reduced junction leakages, due to more tolerant operating temperatures for the IC stack, etc. The heat absorbed by the cooling fluid may then be carried by the circulation driver to a heat sink external to the IC device, freeing up space on the IC chip. In addition, the continuous cooling channels may be utilized to deliver chemicals to the lower levels of the IC device during or after fabrication.

While the disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the disclosure is intended to encompass all such alternatives, modifications and variations which fall within the scope and spirit of the disclosure and the following claims.

What is claimed is:

1. An integrated circuit chip having a continuous cooling channel extending through back end of the line (BEOL) of the chip comprising:
  a pair of vertical channel openings extending through two or more dielectric layers in the back end of line of the chip, wherein each vertical channel opening has a bottom and a top;
  a horizontal channel opening connecting the pair of vertical channel openings at their bottoms; and
  a barrier layer having a vertical portion on a sidewall of each of the vertical channel openings and a horizontal portion,
    wherein the horizontal portion of the barrier layer extends laterally into each of the vertical channel openings at a location where the dielectric layers meet, and
    wherein the horizontal portion extends only partially into the vertical channel opening such that a sidewall of the horizontal portion of the barrier layer is exposed;
  a pair of plugs at the top of the pair of vertical channel openings; and
  an electrical interconnect located adjacent to the channel opening, wherein the electrical interconnect includes one or more layers of a conductive material.

* * * * *